United States Patent
Chen et al.

(10) Patent No.: US 12,191,403 B2
(45) Date of Patent: Jan. 7, 2025

(54) METHOD OF MANUFACTURING MERGED PIN SCHOTTKY (MPS) DIODE

(71) Applicant: LEAP Semiconductor Corp., Taoyuan (TW)

(72) Inventors: Wei-Fan Chen, Taichung (TW); Kuo-Chi Tsai, Taoyuan (TW)

(73) Assignee: LEAP Semiconductor Corp., Taoyuan (TW)

( * ) Notice: Subject to any disclaimer, the term of this patent is extended or adjusted under 35 U.S.C. 154(b) by 0 days.

(21) Appl. No.: 18/619,182

(22) Filed: Mar. 28, 2024

(65) Prior Publication Data

US 2024/0234590 A1    Jul. 11, 2024

Related U.S. Application Data

(62) Division of application No. 17/711,013, filed on Mar. 31, 2022, now Pat. No. 11,990,553.

(51) Int. Cl.
| | |
|---|---|
| *H01L 29/872* | (2006.01) |
| *H01L 29/06* | (2006.01) |
| *H01L 29/66* | (2006.01) |
| *H01L 29/868* | (2006.01) |

(52) U.S. Cl.
CPC ........ *H01L 29/872* (2013.01); *H01L 29/0619* (2013.01); *H01L 29/66143* (2013.01); *H01L 29/868* (2013.01)

(58) Field of Classification Search
CPC ............... H01L 29/872; H01L 29/0619; H01L 29/66143; H01L 29/868; H01L 29/6606; H01L 29/1608; H01L 29/0623; H01L 29/417
See application file for complete search history.

(56) References Cited

U.S. PATENT DOCUMENTS

| | | | | |
|---|---|---|---|---|
| 8,653,534 | B2 * | 2/2014 | Zhang | H01L 29/872 257/77 |
| 9,748,411 | B2 * | 8/2017 | Saggio | H01L 23/535 |
| 2007/0096239 | A1 * | 5/2007 | Cao | H01L 29/66196 257/458 |
| 2017/0365669 | A1 * | 12/2017 | Kim | H01L 29/0623 |
| 2021/0202470 | A1 * | 7/2021 | Hsieh | H01L 29/407 |
| 2022/0085169 | A1 * | 3/2022 | Shimizu | H01L 29/66068 |

* cited by examiner

*Primary Examiner* — Khaja Ahmad
*Assistant Examiner* — Khatib A Rahman
(74) *Attorney, Agent, or Firm* — JCIPRNET

(57) ABSTRACT

A merged PiN Schottky (MPS) diode includes a substrate, a first epitaxial layer of a first conductivity type, doped regions of a second conductivity type, a second epitaxial layer of the first conductivity type, and a Schottky metal layer. The first epitaxial layer is disposed on the first surface of the substrate. The doped regions are disposed in a surface of the first epitaxial layer, wherein the doped regions consist of first portions and second portions, the first portions are electrically floating, and the second portions are electrically connected to a top metal. The second epitaxial layer is disposed on the surface of the first epitaxial layer, wherein trenches are formed in the second epitaxial layer to expose the second portions of the doped regions. The Schottky metal layer is conformally deposited on the second epitaxial layer and the exposed second portions of the doped regions.

6 Claims, 5 Drawing Sheets

METHOD OF MANUFACTURING MERGED PIN SCHOTTKY (MPS) DIODE

CROSS-REFERENCE TO RELATED APPLICATION

This application is a divisional application of and claims the priority benefit of a prior U.S. application Ser. No. 17/711,013, filed on Mar. 31, 2022. The entirety of the above-mentioned patent application is hereby incorporated by reference herein and made a part of this specification.

BACKGROUND

Technical Field

The disclosure relates to a wide bandgap semiconductor rectifying device, and particularly relates to a merged PiN Schottky (MPS) diode and a method of manufacturing the same.

Description of Related Art

A silicon semiconductor rectifying device includes a PiN diode having a pn junction and a Schottky barrier diode (SBD) having a carrier potential barrier of a difference in work function between a semiconductor layer and metal, and it can rectify an input current to output the rectified current. In the SBD, a Junction Barrier Schottky (JBS) diode is disposed on a surface of the semiconductor layer in order to relax an electric field applied to an interface between the semiconductor layer and the metal. The JBS includes a doping region (for example, p type) having a conductive type different from that of the semiconductor layer (for example, n type). There is also an MPS (Merged PiN Schottky) diode, in which the contact between the p type region and the metal of the JBS is set to or brought close to ohmic connection, and a minority carrier is injected to decrease a resistance by conductivity modulation when a voltage exceeding a built-in potential (Vbi) between the doping region and the semiconductor layer is applied.

On the other hand, a wide bandgap semiconductor such as silicon carbide (SiC) is expected as a next-generation power semiconductor device. The wide bandgap semiconductor has a wide bandgap, high breakdown field strength, and high thermal conductivity compared with Si. A low-loss power semiconductor device that can be operated at high temperature can be implemented using the characteristics of the wide bandgap semiconductor.

However, the JBS diode has reverse current leakage issue due to the desired large Schottky contact area, and thus forward voltage $V_F$ characteristics will be deteriorated.

SUMMARY

The disclosure provides a merged PiN Schottky (MPS) diode having reduced current leakage with improved Schottky contact area and forward voltage $V_F$ characteristics.

The disclosure further provides a method of manufacturing a merged PiN Schottky diode capable of improving Schottky contact area without increasing current leakage.

The merged PiN Schottky diode of the disclosure includes a substrate, a first epitaxial layer of a first conductivity type, doped regions of a second conductivity type, a second epitaxial layer of the first conductivity type, and a Schottky metal layer. The first epitaxial layer is disposed on the first surface of the substrate. The doped regions are disposed on a surface of the first epitaxial layer, wherein the doped regions consist of the first portions and the second portions, the first portions are electrically floating, and the second portions are electrically connected to a top metal. The second epitaxial layer is disposed on the surface of the first epitaxial layer, wherein trenches are formed in the second epitaxial layer to expose the second portions of the doped regions. The Schottky metal layer is conformally deposited on the second epitaxial layer and the exposed second portions of the doped regions.

In an embodiment of the disclosure, a spacing between the first portion and the second portion is 0.3 μm to 3 μm.

In an embodiment of the disclosure, a width of each of the second portions of the doped regions is 0.3 μm to 2 μm.

In an embodiment of the disclosure, the first conductivity type is n-type, and the second conductivity type is p-type.

In an embodiment of the disclosure, the first conductivity type is p-type, and the second conductivity type is n-type.

In an embodiment of the disclosure, the substrate is a SiC substrate of the first conductivity type with a doping concentration of $1E18/cm^3$ to $2E20/cm^3$.

In an embodiment of the disclosure, a doping concentration of the first epitaxial layer is $2E15/cm^3$ to $1E17/cm^3$.

In an embodiment of the disclosure, the top metal layer is formed on the Schottky metal layer and fills the trenches.

In an embodiment of the disclosure, the merged PiN Schottky diode further includes a backside metal disposed on the second surface of the substrate.

The method of manufacturing the merged PiN Schottky diode of the disclosure includes forming a first epitaxial layer of a first conductivity type on a first surface of a substrate; forming doped regions of a second conductivity type on a surface of the first epitaxial layer, wherein the doped regions consist of first portions and second portions; forming a second epitaxial layer of the first conductivity type on the surface of the first epitaxial layer; forming a plurality of trenches in the second epitaxial layer to expose the second portions of the doped regions; and conformally depositing a Schottky metal layer on the second epitaxial layer and the second portions of the doped regions. The first portions of the doped regions are electrically floating in the first and the second epitaxial layers, and the second portions of the doped regions are electrically connected to a top metal.

In another embodiment of the disclosure, after conformally depositing the Schottky metal layer, the top metal layer is formed on the Schottky metal layer to fill the trenches.

In another embodiment of the disclosure, after forming the top metal layer, the method further includes forming a backside metal disposed on a second surface of the substrate, and the second surface is opposite to the first surface.

In all embodiments of the disclosure, the first portions and the second portions are alternately arranged along a direction perpendicular to an extension direction of the trenches.

In all embodiments of the disclosure, a doping concentration of the second epitaxial layer is equal to or higher than that of the first epitaxial layer.

In all embodiments of the disclosure, a doping concentration of the second epitaxial layer is 1.2 times to 3 times that of the first epitaxial layer.

Based on the above, the disclosure provides floating doped regions around the biased doped regions, and the conductivity types of the floating doped regions and the biased doped regions are the same, and thus the current leakage can be reduced by the floating doped regions in the case of increasing the Schottky contact area. In addition, the depletion region can not occur due to the presence of the floating doped regions, since there is no potential difference at the floating doped regions, the forward voltage $V_F$ characteristics will be improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
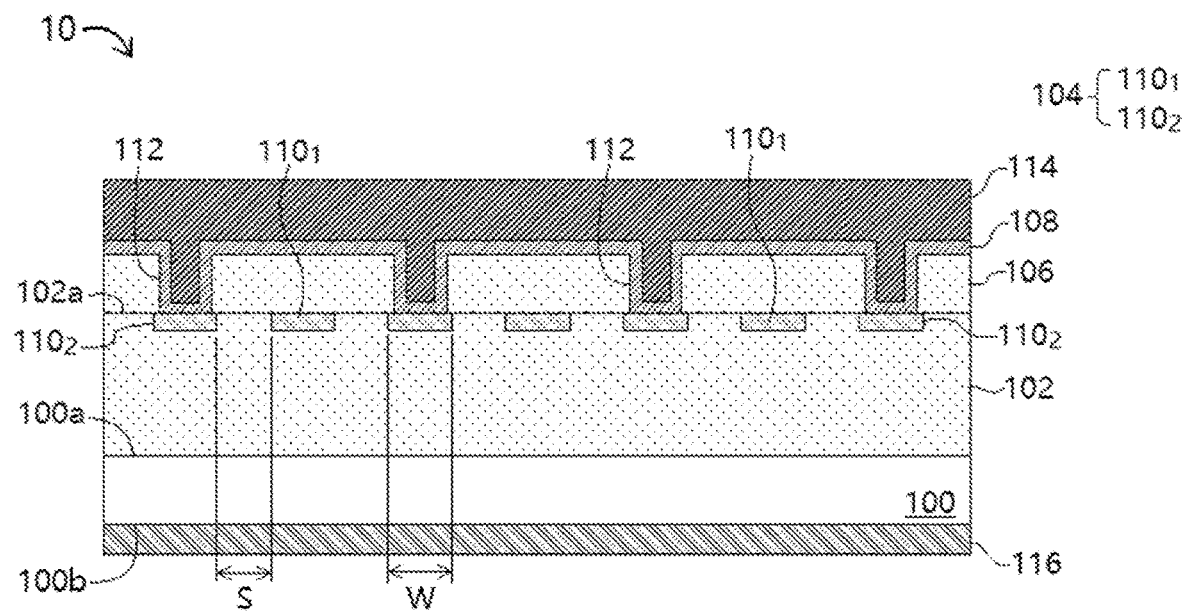
FIG. 1A is a cross-sectional view of a merged PiN Schottky (MPS) diode according to an embodiment of the disclosure.

With reference to the drawings attached, the disclosure will be described by means of the embodiments below. Nevertheless, the disclosure may be embodied in many different forms and should not be construed as limited to the embodiments set forth herein. In the drawings, for the purpose of clarity and specificity, the sizes and the relative sizes of each layer and region may not be illustrated in accurate proportion.

FIG. 1A is a cross-sectional view of a merged PiN Schottky diode according to an embodiment of the disclosure.

Referring to FIG. 1A, the merged PIN Schottky diode 10 of the embodiment includes at least a substrate 100, a first epitaxial layer 102 of a first conductivity type, doped regions 104 of a second conductivity type, a second epitaxial layer 106 of the first conductivity type, and a Schottky metal layer 108. In one embodiment, the first conductivity type is n-type, and the second conductivity type is p-type. In another embodiment, the first conductivity type is p-type, and the second conductivity type is n-type. The substrate 100 may be a high doping wideband semiconductor substrate such as a silicon carbide (SiC) substrate of the first conductivity type with a doping concentration of $1E18/cm^3$ to $2E20/cm^3$. The first epitaxial layer 102 is disposed on the first surface 100a of the substrate 100, wherein a thickness of the first epitaxial layer 102 is, for instance, 4 µm to 15 µm, and a doping concentration of the first epitaxial layer 102 is, for instance, $2E15/cm^3$ to $1E17/cm^3$.

The doped regions 104 are disposed on a surface 102a of the first epitaxial layer 102, wherein the doped regions 104 consist of first portions $110_1$ and second portions $110_2$, the first portions $110_1$ are electrically floating, and the second portions $110_2$ are electrically connected (and biased) to a top metal 114. The so-called "floating" refers to a part of the body that is not connected to another part of the body, and thus "electrically floating" refers to the portions are not electrically connected to other portions, conductive layers, wires, interconnection, etc. The top metal 114 is formed on the Schottky metal layer 108. The floating first portions $110_1$ can prevent the electric field from the substrate 100 from flowing into the second epitaxial layer 106. That is, the first portions $110_1$ can pinch off the electrical field, and accordingly, the current leakage can be reduced by the floating doped regions even if the Schottky contact area becomes larger. Moreover, since the locations of the first portions $110_1$ do not occur depletion region, there is no potential difference at the first portions $110_1$ so as to improve the current density therein, thereby improving the forward voltage $V_F$ characteristics.

The second epitaxial layer 106 is disposed on the surface 102a of the first epitaxial layer 102, wherein a thickness of the second epitaxial layer 106 is, for instance, 0.3 µm to 2 µm, and a doping concentration of the second epitaxial layer 106 is equal to or higher than that of the first epitaxial layer 102. In one embodiment, the doping concentration of the second epitaxial layer 106 is light higher than that of the first epitaxial layer 102 to obtain high enough reverse blocking voltage for the lower drift layer (i.e. the first epitaxial layer 102), while the higher doping concentration in drift layer (i.e. the second epitaxial layer 106) can lower Schottky barrier height of the Schottky contacts that results in lower $V_F$ of the disclosure. For example, the doping concentration of the second epitaxial layer 106 is 1.2 times to 3 times that of the first epitaxial layer 102. The doping concentration of the second epitaxial layer 106 is, for instance, $2.5E15/cm^3$ to $2E17/cm$.

In the second epitaxial layer 106, trenches 112 are formed to expose the second portions $110_2$ of the doped regions 104, and the trenches 112 are normally parallel each other. The width W of each of the second portions $110_2$ of the doped regions 104 is, for instance, 0.3 µm to 2 µm, which depends on the manufacturing technology. The spacing S between the first portion $110_1$ and the second portion $110_2$ is, for instance, 0.3 µm to 3 µm, which is the function of the doping concentration of the first epitaxial layer 102. In case the doping concentration of the first epitaxial layer 102 is $2E16/cm^3$, the spacing S is 0.3 µm (for 600V device). In case the doping concentration of the first epitaxial layer 102 is $1E15/cm^3$, the spacing S is 3 µm (for 3300V device); and so on. As shown in FIG. 1A, the first portions $110_1$ and the second portions $110_2$ are alternately arranged along a direction perpendicular to an extension direction of the trenches 112; however, the disclosure is not limited thereto. For example, the arrangement of the doped regions 104 may be two second portions $110_2$ and one first portion $110_1$ alternately arranged, and so on.

Figure 1B:
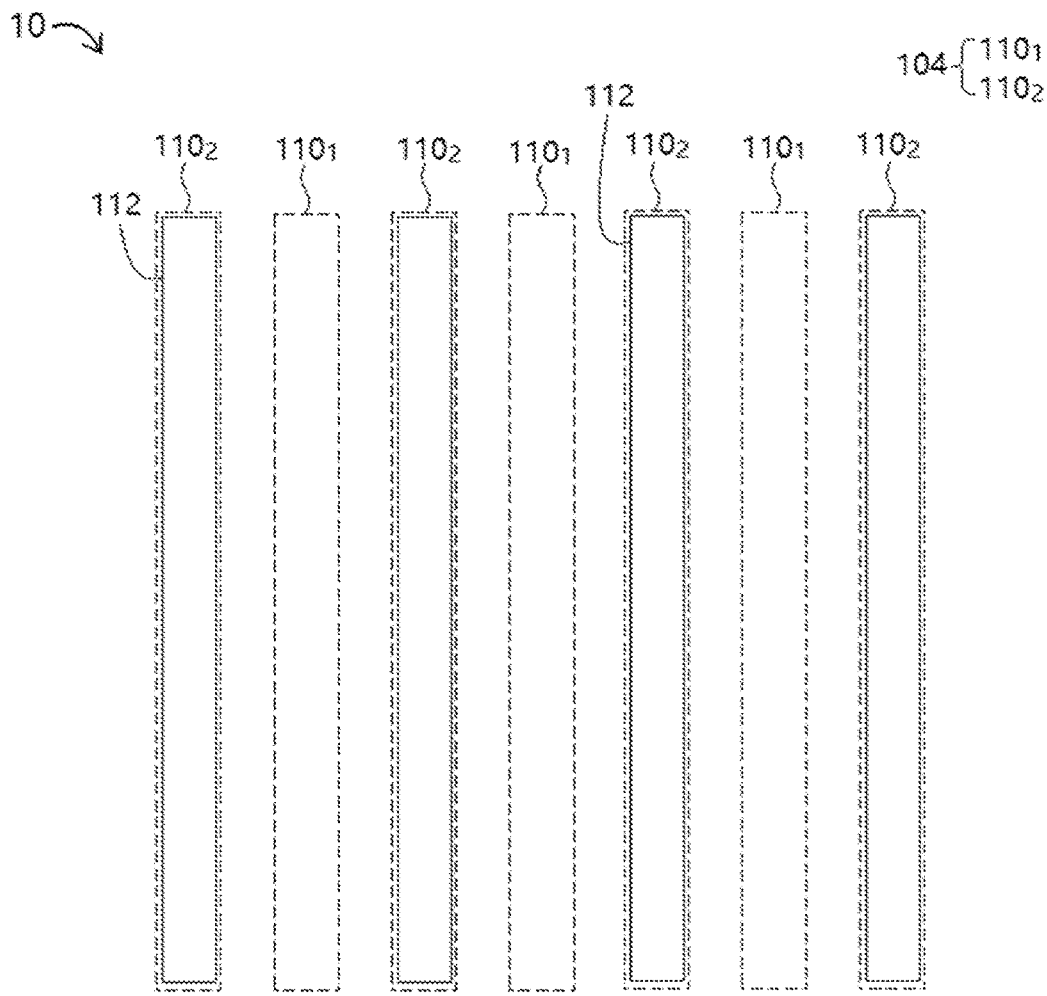
FIG. 1B is a plane view of the merged PiN Schottky diode of FIG. 1A.

FIG. 1B is a plane view of the merged PiN Schottky diode of FIG. 1A, wherein some elements are omitted in FIG. 1B to clarify the positional relationship of the trenches 112, and the first portion $110_1$ and the second portion $110_2$ of the doped regions 104, and the top metal 114. It is clear that the trenches 112 are directly over the second portions $110_2$ of the doped regions 104, and the first portions $110_1$ and the second portions $110_2$ are alternately arranged along a direction perpendicular to the extension direction of the trenches 112.

Referring to FIG. 1A again, the Schottky metal layer 108 is conformally deposited on the second epitaxial layer 106 and the exposed second portions $110_2$ of the doped regions 104. In particular, the Schottky metal layer 108 is on the top of the second epitaxial layer 106, sidewall of the trenches 112 as well as the bottom of the trenches 112, and the Schottky metal layer 108 is electrically connected to the second portions $110_2$ of the doped regions 104. The material of the Schottky metal layer 108 comprises a refractory metal silicide or a refractory metal, wherein the refractory metal is, for instance, Ti, Ni, W, or Mo; the refractory metal silicide is, for instance, titanium silicide, nickel silicide, tungsten silicide, or molybdenum silicide. The trenches 112 are filled with the top metal 114, wherein a material of the top metal 114 is, for instance, aluminum or gold. The merged PiN Schottky diode 10 further includes a backside metal 116 disposed on the second surface 100b of the substrate 100, wherein a material of the backside metal 116 is, for instance, metal silicide such as nickel silicide.

FIGS. 2A to 2F are cross-sectional views illustrating a processing flow of manufacturing a merged PiN Schottky diode according to another embodiment of the disclosure, wherein the reference symbols used in above embodiment are used to equally represent the same or similar components. The description of the same components can be derived from above embodiment, and will not be repeated herein.

Figure 2A:
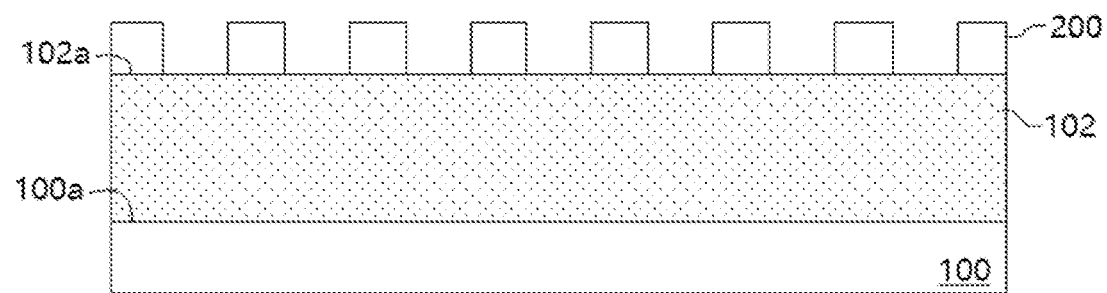
FIGS. 2A to 2F are cross-sectional views illustrating steps of a method of manufacturing a merged PiN Schottky diode according to another embodiment of the disclosure.

Referring to FIG. 2A, a first epitaxial layer 102 of a first conductivity type is formed on a first surface 100a of a substrate 100. The substrate 100 may be a high doping wideband semiconductor substrate of the first conductivity type, and the thickness and the doping concentration of first epitaxial layer 102 can refer to above embodiment, and will not be repeated herein. An implant block layer 200 is formed on the surface 102a of the first epitaxial layer 102 and then patterned for subsequent implantation, wherein the implant block layer 200 is, for instance, a $SiO_2$ layer or a $Si_3N_4$ layer.

Figure 2B:
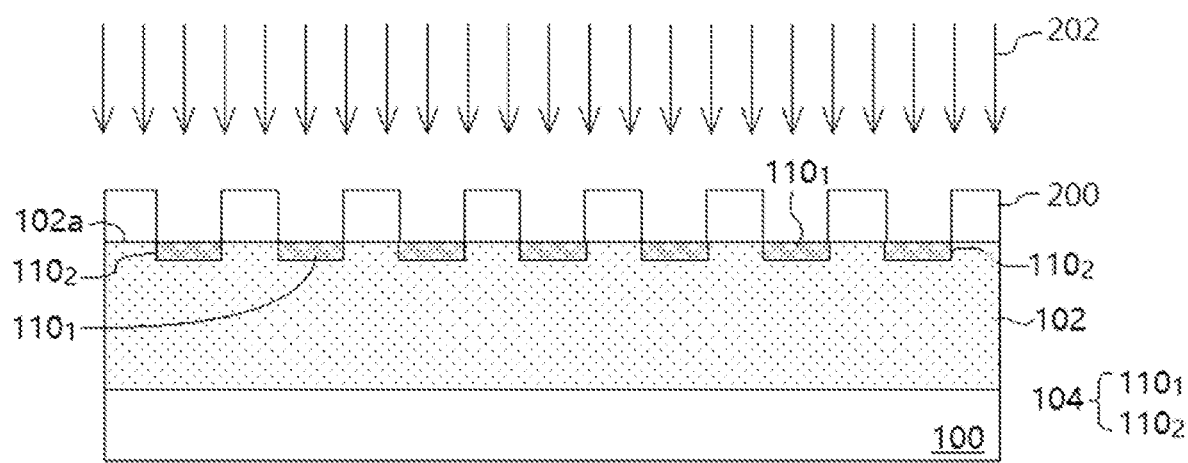

Then, referring to FIG. 2B, doped regions 104 of a second conductivity type is formed in the surface 102a of the first epitaxial layer 102 through an ion implantation 202 of the second conductivity type, wherein the doped regions 104 consist of first portions $110_1$ and second portions $110_2$. In one embodiment, the first portions $110_1$ and the second portions $110_2$ are parallel each other; however, the disclosure is not limited thereto. For example, shapes of the first portions $110_1$ may be square, circle, or rectangle.

Figure 2C:
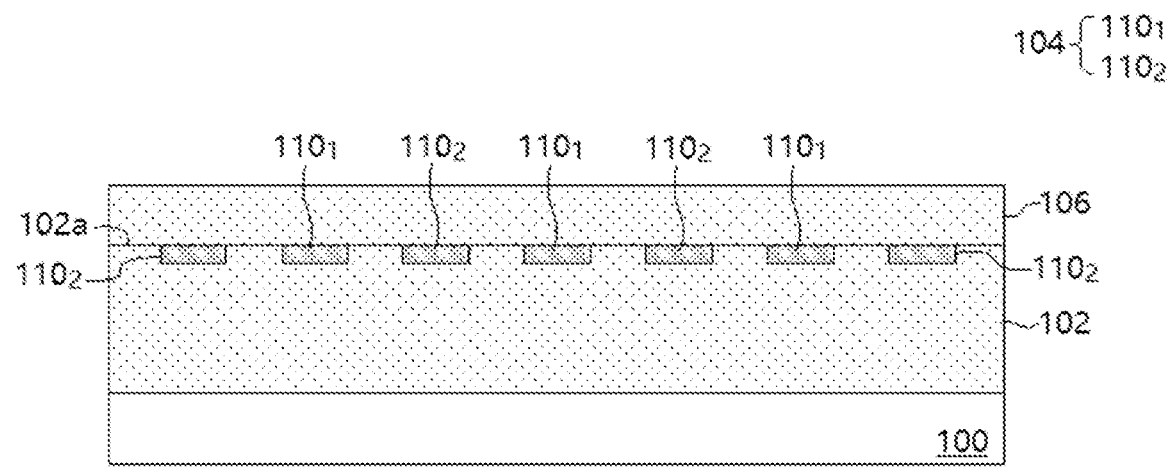

After that, referring to FIG. 2C, the implant block layer 200 is removed, and an anneal is performed to form a PN junction (between the doped regions 104 and the first epitaxial layer 102) at the surface 102a of the first epitaxial layer 102. A second epitaxial layer 106 of the first conductivity type is then formed on the surface 102a of the first epitaxial layer 102, wherein a doping concentration of the second epitaxial layer 106 is equal to or higher than that of the first epitaxial layer 102. In one embodiment, the doping concentration of the second epitaxial layer 106 is 1.2 times to 3 times that of the first epitaxial layer 102.

Figure 2D:
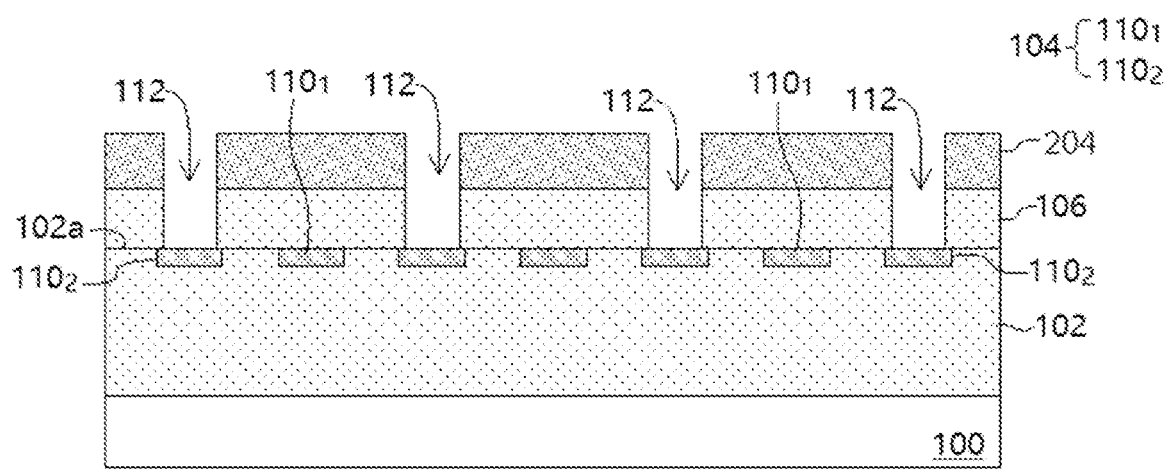

Thereafter, referring to FIG. 2D, an etch block layer 204 is formed on the second epitaxial layer 106 and then patterned for subsequent etching. Trenches 112 are formed in the second epitaxial layer 106 by using the etch block layer 204 as an etching mask. The trenches 112 expose the second portions $110_2$ of the doped regions 104, wherein the first portions $110_1$ and the second portions $110_2$ are alternately arranged along a direction perpendicular to an extension direction of the trenches 112, and the second portions $110_2$ are covered by the second epitaxial layer 106.

Figure 2E:
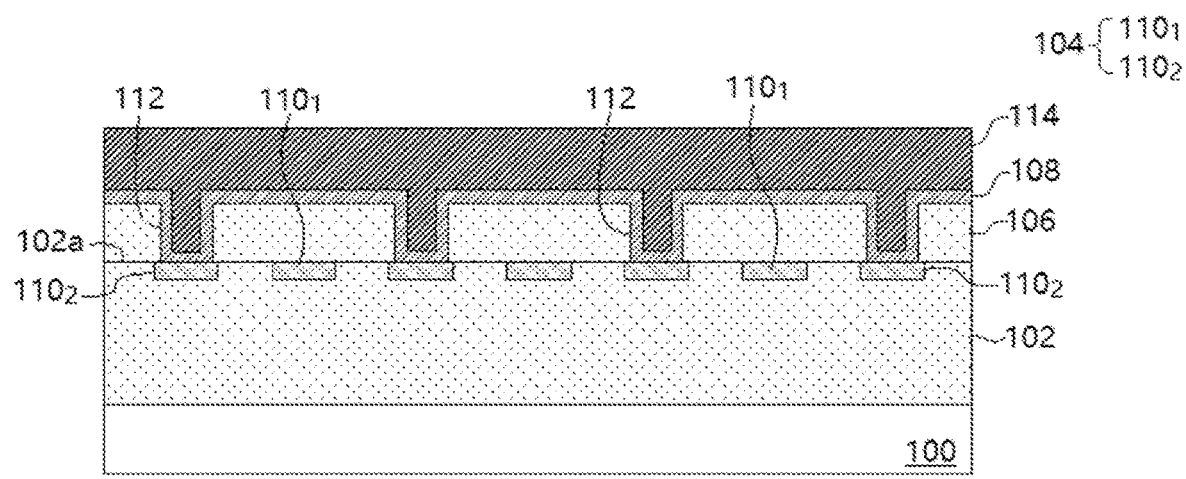

Referring to FIG. 2E, a Schottky metal layer 108 is conformally deposited on the second epitaxial layer 106 and the second portions $110_2$ of the doped regions 104 to form ohmic contact and Schottky contact at the same time. The first portions $110_1$ are electrically floating, and the second portions $110_2$ are electrically connected to a top metal 114. The top metal 114 may be formed on the Schottky metal layer 108 to fill the trenches 112.

Figure 2F:
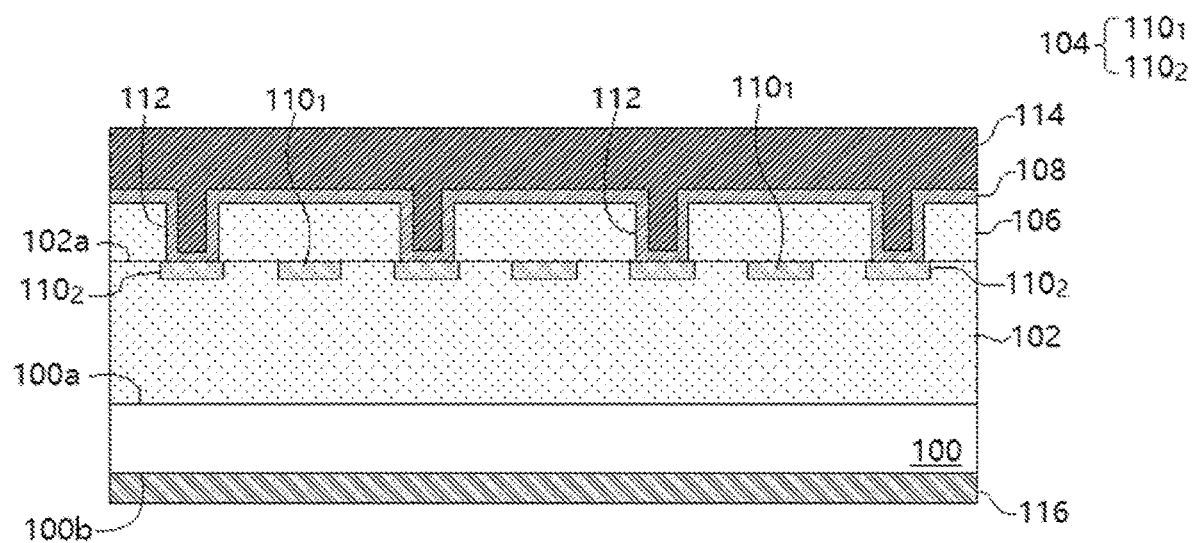

After that, referring to FIG. 2F, a backside metal 116 may be disposed on a second surface 100b of the substrate 100 followed by back side grinding, wherein the second surface 100b is opposite to the first surface 100a.

The following is simulation experiments to verify the efficacy of the disclosure, but the disclosure is not limited to the description below.

Simulation Example 1

Simulation software: Victory process as well as device simulator of Silvaco software, the complex physical phenomena of device level's behavior can be executed physics-based device simulations to predict and understand device performance. The simulation results are based on the N-type epi with concentration of $2E16/cm^3$ of SiC merge PN junction device. The spacing S between the first portion $110_1$ and the second portion $110_2$ is assumed 0.3 μm. The N-type epi concentration of the second epitaxial layer 106 is $4E16/cm^3$, while the width W of the second portions $110_2$ is also assumed 0.2 μm, herein, the width W of the second portions $110_2$ is derived from the PN junction area ratio of the Table 1 accordingly.

Figure 3:
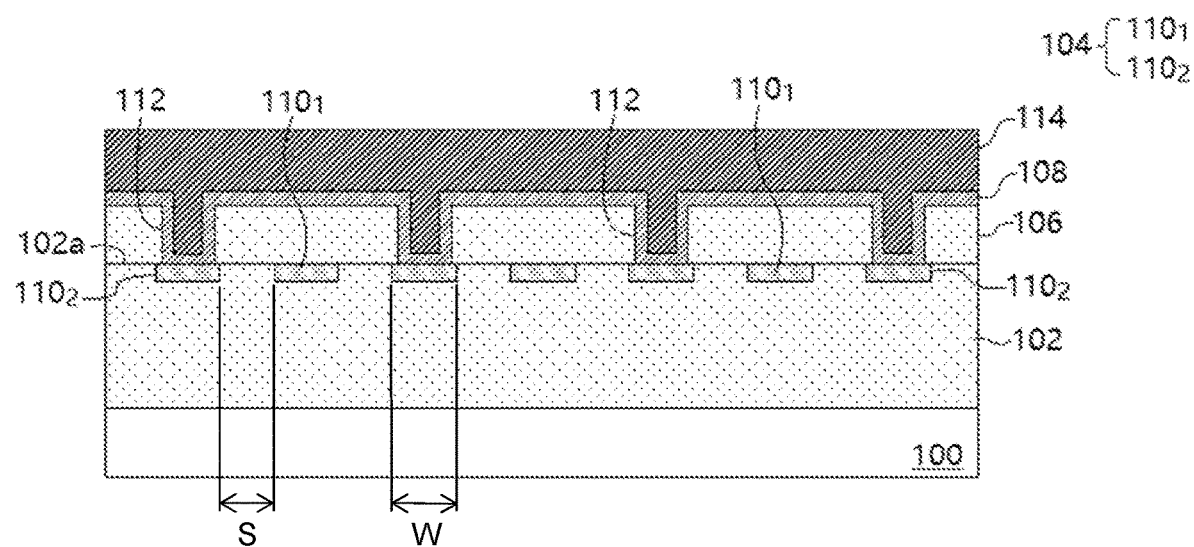
FIG. 3 is a cross-sectional view showing the PN junction area ratio in Simulation Examples 1-2.

Please refer to FIG. 3, some elements are omitted in FIG. 3 to clarify the positional relationship among the trenches 112, the Schottky metal layer 108, the first portion $110_1$ and the second portion $110_2$ of the doped regions 104, and the top metal 114. If the total area of the spacing S is X, and the total area of the buried PN junction is Y, the PN junction area ratio equals to $100\% \times Y/(X+Y)$. The simulation results of IR leakage with the PN junction area ratio change are shown in Table 1 below.

Comparative Simulation Example 1

Figure 4:
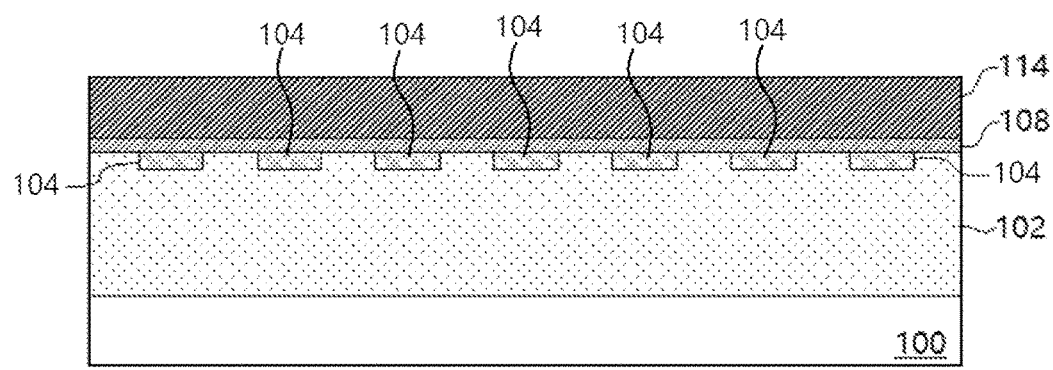
FIG. 4 is a cross-sectional view showing the PN junction area ratio in Comparative Simulation Examples 1-2.

The simulation conditions are the same as Simulation Example 1 except for all doped regions being in electrically contact with the Schottky metal layer as shown in FIG. 4. In FIG. 4, some elements are omitted to clarify the positional relationship of the doped regions 104, the Schottky metal layer 108, and the top metal 114. If the total area of the spacing between the doped regions 104 is X, and the total area of the doped regions 104 is Y, the PN junction area ratio equals to $100\% \times Y/(X+Y)$.

The simulation results of IR leakage with the PN junction area ratio change are also shown in Table 1 below.

TABLE 1

|  |  | 90% of PN junction area ratio | 75% of PN junction area ratio | 50% of PN junction area ratio | 25% of PN junction area ratio | 10% of PN junction area ratio |
|---|---|---|---|---|---|---|
| IR leakage at 600 V | Simulation Example 1 | 2.2 μA | 2.3 μA | 2.6 μA | 3.5 μA | 4.5 μA |
| IR leakage at 600 V | Comparative Simulation Example 1 | 2.2 μA | 6.5 μA | 14 μA | 61.6 μA | 84.2 μA |

According to Table 1, the IR leakage of Comparative Simulation Example 1 is significantly greater than that of Simulation Example 1, especially when the PN junction area ratio becomes smaller.

Simulation Example 2

The simulation software is the same as Simulation Example 1, and the simulation results of the Current @$V_F$=1.5 V with the PN junction area ratio change are shown in Table 2 below.

Comparative Simulation Example 2

The simulation conditions are the same as Simulation Example 2 except for the second portions being electrically connected to a metal line connecting with the first portions via an interconnection.

The simulation results of the Current @$V_F$=1.5 V with the PN junction area ratio change are also shown in Table 2 below.

TABLE 2

|  |  | 90% of PN junction area ratio | 75% of PN junction area ratio | 50% of PN junction area ratio | 25% of PN junction area ratio | 10% of PN junction area ratio |
|---|---|---|---|---|---|---|
| Current @$V_F$ = 1.5 V | Simulation Example 2 | 5.8 A | 9.6 A | 13 A | 17.4 A | 21.2 A |
| Current @$V_F$ = 1.5 V | Comparative Simulation Example 2 | 2.7 A | 7.0 A | 11.2 A | 15.5 A | 19.8 A |

According to Table 2, the Current @$V_F$=1.5 V of Comparative Simulation Example 2 is less than that of Simulation Example 2.

In summary, since the merged PiN Schottky diode according to the disclosure has floating doped regions in the drift layer, the current leakage can be reduced even if the Schottky contact area becomes larger, and the forward voltage $V_F$ characteristics can also be improved due to the floating doped regions. Moreover, the doping concentration of the second epitaxial layer can be light higher than that of the first epitaxial layer resulting in further reduction in forward voltage $V_F$ characteristics for the low Schottky barrier height for the higher drift layer.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of manufacturing a merged PiN Schottky (MPS) diode, comprising:
   forming a first epitaxial layer of a first conductivity type on a first surface of a substrate;
   forming a plurality of doped regions of a second conductivity type in a surface of the first epitaxial layer, wherein the doped regions consist of first portions and second portions;
   forming a second epitaxial layer of the first conductivity type on the surface of the first epitaxial layer;
   forming a plurality of trenches in the second epitaxial layer to expose the second portions of the doped regions; and
   conformally depositing a Schottky metal layer on the second epitaxial layer and the second portions of the doped regions, wherein the first portions are electrically floating, and the second portions are electrically connected to a top metal.

2. The method of manufacturing the MPS diode of claim 1, wherein the first portions and the second portions are alternately arranged along a direction perpendicular to an extension direction of the trenches.

3. The method of manufacturing the MPS diode of claim 1, wherein a doping concentration of the second epitaxial layer is equal to or higher than that of the first epitaxial layer.

4. The method of manufacturing the MPS diode of claim 1, wherein a doping concentration of the second epitaxial layer is 1.2 times to 3 times that of the first epitaxial layer.

5. The method of manufacturing the MPS diode of claim 1, wherein after conformally depositing the Schottky metal layer, further comprising forming the top metal layer on the Schottky metal layer to fill the trenches.

6. The method of manufacturing the MPS diode of claim 5, wherein after forming the top metal layer, further comprising forming a backside metal disposed on a second surface of the substrate, and the second surface is opposite to the first surface.

* * * * *